(12) United States Patent
Osada et al.

(10) Patent No.: US 8,184,426 B2
(45) Date of Patent: May 22, 2012

(54) DIELECTRIC ELEMENT AND METHOD FOR PRODUCING THE DIELECTRIC ELEMENT

(75) Inventors: Minoru Osada, Ibaraki (JP); Yasuo Ebina, Ibaraki (JP); Takayoshi Sasaki, Ibaraki (JP)

(73) Assignee: National Institute for Materials Science, Ibaraki (JP)

( * ) Notice: Subject to any disclaimer, the term of this patent is extended or adjusted under 35 U.S.C. 154(b) by 272 days.

(21) Appl. No.: 12/448,528

(22) PCT Filed: Dec. 20, 2007

(86) PCT No.: PCT/JP2007/074552
§ 371 (c)(1),
(2), (4) Date: Apr. 21, 2010

(87) PCT Pub. No.: WO2008/078652
PCT Pub. Date: Jul. 3, 2008

(65) Prior Publication Data
US 2010/0226067 A1 Sep. 9, 2010

(30) Foreign Application Priority Data
Dec. 25, 2006 (JP) .................................. 2006-347520

(51) Int. Cl.
*H01G 4/06* (2006.01)
(52) U.S. Cl. ..................... 361/311; 361/321.1; 361/309; 361/312; 361/313; 361/321.2
(58) Field of Classification Search .................. 361/311, 361/301.2, 301.4, 309, 312–313, 321.1, 321.2, 361/303–305, 306.1
See application file for complete search history.

(56) References Cited

U.S. PATENT DOCUMENTS

| | | | | |
|---|---|---|---|---|
| 6,605,515 | B2 * | 8/2003 | Kitagawa et al. | 438/393 |
| 6,930,875 | B2 * | 8/2005 | Sakashita | 361/306.3 |
| 7,031,138 | B2 * | 4/2006 | Moon et al. | 361/312 |
| 7,271,114 | B2 * | 9/2007 | Kawamura et al. | 501/134 |
| 7,281,321 | B2 * | 10/2007 | Kim et al. | 29/832 |
| 7,339,219 | B2 * | 3/2008 | Kondo et al. | 257/295 |
| 7,428,137 | B2 * | 9/2008 | Dowgiallo, Jr. | 361/321.2 |
| 2006/0115915 | A1 | 6/2006 | Takahashi | |

FOREIGN PATENT DOCUMENTS

| | | |
|---|---|---|
| JP | 2002-42909 | 2/2002 |
| JP | 2005-306728 | 11/2005 |
| JP | 2006-156076 | 6/2006 |
| JP | 2006-256875 | 9/2006 |
| JP | 2006-265053 | 10/2006 |

OTHER PUBLICATIONS

International Search Report dated Feb. 12, 2008 in the International (PCT) Application PCT/JP2007/074552 of which the present application is the U.S. National Stage.

* cited by examiner

*Primary Examiner* — Nguyen T Ha
(74) *Attorney, Agent, or Firm* — Wenderoth, Lind & Ponack, L.L.P.

(57) ABSTRACT

Provided is a dielectric element comprising a dielectric thin film formed of a layer of perovskite nanosheets. The dielectric element has the advantages of inherent properties and high-level texture and structure controllability of the perovskite nanosheets, therefore realizing both a high dielectric constant and good insulating properties in a nano-region.

13 Claims, 3 Drawing Sheets

US 8,184,426 B2

DIELECTRIC ELEMENT AND METHOD FOR PRODUCING THE DIELECTRIC ELEMENT

TECHNICAL FIELD

The present invention relates to a dielectric element such as a DRAM memory for personal computers, a multilayer capacitor for mobile telephones, a gate insulator for transistors and others, or that is, a dielectric element comprising a dielectric thin film formed between electrodes, and to a method for producing it.

BACKGROUND ART

Of the dielectric elements of the type, those having a high dielectric constant are utilized in all electronic instruments such as computers, mobile telephones and others, and act in the core of electronic instruments, for example, in the memory, the transistor gate insulating film or the like thereof. The current remarkable development of electronic instruments such as personal computers, mobile telephones and others is supported by the advanced functions of dielectric elements. Heretofore, the development of dielectric elements and the advanced functions thereof have been realized by the technology of microstructuring and high-integration (top-down technology) based on the forefront of film formation technology and semiconductor fabrication technology. For example, in DRAM and transistor, the thickness of the dielectric thin film is being reduced year by year, as aiming at capacity increase; and a nanometer-order thin film structure has already been used everywhere in the devices. However, physical and economical limits are approaching close at hand in the microstructuring and high-density integration increase technology; and for brake-through to realization of next-generation devices, it is now indispensable to unite the creation of novel dielectric materials and nanotechnology.

Of many dielectric materials, perovskite-type oxides have excellent dielectric properties (specific dielectric constant, at least 200); and from the beginning of 1990's, application studies of the oxides to electronic devices such as memory cells, transistors and others have been made.

Recently, development of capacitor insulating films for high-capacity DRAM memory cells and monolithic microwave integration circuits, using perovskite-type oxides, is positively made; and a trial of applying high-dielectric perovskite-type oxides such as $(Ba,Sr)TiO_3$, $Pb(Zr,Ti)O_3$ or the like, in place of current $SiO_2$ or $SiN_x$, has proven good practicability of those oxides.

DISCLOSURE OF INVENTION

Problems that the Invention is to Solve

At present, however, perovskite-type oxides such as $(Ba,Sr)TiO_3$ or the like that are the candidates for high-dielectric thin films have some problems in that they may cause substrate interface deterioration and also composition deviation and electric incompatibility with it, owing to thermal annealing in the process of producing them. In addition, many of those materials have an intrinsic problem in that, when their film is thinned to a nano-level, aiming at capacity increase, then their specific dielectric constant lowers, thereby causing the "size effect" of increasing leak current. Accordingly, it is desired to develop a nanomaterial having a high dielectric constant, which realizes a high dielectric constant and good insulating properties even in a nano-region and enables device production at low temperature with no influence of substrate interference deterioration and composition deviation thereon.

Under the background as above, the invention is to provide a perovskite oxide thin film capable of realizing both a high dielectric constant and good insulating properties in a nano-region, and to provide a method for producing it.

Means for Solving the Problems

For solving the above-mentioned problems, the invention is characterized by the following means.

The dielectric element of the invention 1 is a dielectric element comprising a dielectric thin film formed between electrodes, wherein the dielectric thin film is formed of a layer of perovskite nanosheets.

The dielectric element of the invention 2 is characterized in that, in the invention 1, the perovskite nanosheets have a multilayer structure laminated via a cationic organic polymer.

The dielectric element of the invention 3 is characterized in that, in the invention 1 or 2, the thickness of the dielectric thin film is at most 20 nm and the specific dielectric constant thereof is at least 150.

The invention 4 is characterized in that, in any of the inventions 1 to 3, the perovskite nanosheet has a sheet-like configuration having a thickness of at most 5 nm and having a lateral size of from 100 nm to 100 μm.

The invention 5 is characterized in that, in any of the inventions 1 to 4, the perovskite nanosheet is one produced by cleaving a layered perovskite oxide, and the layered perovskite oxide is any one or a hydrate thereof represented by a compositional formula $A_xCa_2Nb_3O_{10-d}$, $A_xCa_{2-y}M_yNb_{3-y}M'_yO_{10-d}$, $A_xM_2M'_3O_{10-d}$ or $A[Ca_{n-1}Na_{n-3}Nb_nO_{3n+1-d}]$ (A is at least one selected from H, Li, Na, K, Rb and Cs, $0<x\leqq1$; M is at least one selected from Sr, Ba, Pb or rare earth elements La, Ce, Pr, Sm, Eu, Gd, Tb, Dy, Ho, Er, Tm, Yb and Lu, $0<y\leqq1$; M' is at least one selected from Ta, Ti, Mg, Mn and Zn, $0<z\leqq3$; n=2 to 4; d=0 to 2).

The invention 6 is characterized in that, in the invention 5, the perovskite oxide has a perovskite structure represented by a compositional formula $Ca_2Nb_3O_{10-d}$, $Ca_{2-y}M_yNb_{3-z}M'_zO_{10-d}$, $M_2M'_3O_{10-d}$ or $[Ca_{n-1}Na_{n-3}Nb_nO_{3n+1-d}]$ ($0<x\leqq1$; M is at least one selected from Sr, Ba, Pb or rare earth elements La, Ce, Pr, Sm, Eu, Gd, Tb, Dy, Ho, Er, Tm, Yb and Lu, $0<y\leqq1$; M' is at least one selected from Ta, Ti, Mg, Mn and Zn, $0<z\leqq3$; n=2 to 4; d=0 to 2).

The invention 7 is a method for producing a dielectric element of any of the inventions 1 to 6, characterized in that perovskite nanosheets are adhered onto at least any one electrode substrate of two electrode substrates constituting a dielectric element, and then the two electrode substrates are so disposed that the perovskite nanosheets can be between the two electrode substrates.

The invention 8 is characterized in that, in the invention 7, the perovskite nanosheets are adhered onto the electrode substrate according to the following adhesion step (A):

wherein the electrode substrate is dipped in a cationic organic polymer solution so that the organic polymer is adsorbed by the surface of the electrode substrate, and then this is further dipped in a colloidal solution with perovskite nanosheets suspended therein to thereby make the perovskite nanosheets adsorbed by the organic polymer.

The invention 9 is characterized in that, in the invention 8, the adhesion step (A) is repeated to form a multilayer structure of perovskite nanosheets.

The invention 10 is characterized in that, in the invention 9, the overlapping parts of the perovskite nanosheets are removed by applying ultrasonic waves thereto.

The invention 11 is characterized in that, in any of the inventions 8 to 10, the organic polymer is removed through irradiation with UV rays after the adhesion step (A).

The invention 12 is characterized in that, in the invention 7, the perovskite nanosheets are adhered onto the electrode substrate according to the following adhesion step (B):

wherein a monolayer film with perovskite nanosheets bonded in parallel to each other is formed according to a Langmuir-Blodgett process, and the monolayer film is adhered to the electrode substrate.

The invention 13 is characterized in that, in the invention 12, the adhesion step (B) is repeated to laminate the monolayer films on the electrode substrate to thereby form a multilayer structure of perovskite nanosheets.

Effect of the Invention

The present inventors have found that the perovskite nanosheets (flaky nanoparticles) obtained through single layer cleavage of a layered perovskite oxide can be a high dielectric nanomaterial capable of functioning even though it has a nano-level thickness, and that, when the nanomaterial is used as a backbone block to produce an element through its self-organization at room temperature, then the problem with the thermal annealing in a conventional element production process can be solved, and as a result of further application of these findings, the inventors have reached the present invention.

The invention 1 has made it possible to make good use of the inherent properties and the high-level texture and structure controllability of perovskite nanosheets and has realized both a high dielectric constant and good insulating properties even in a nano-region.

The invention 2 has enabled the hybridization with a polymer material such as an organic polymer, and therefore has enabled the production of organic/inorganic hybrid devices and the application to dielectric elements in molecular electronics, making good use of the excellent dielectric properties of perovskite nanosheets.

The invention 3 has made it possible to provide a dielectric thin film capable of functioning even though it has a nano-scale thickness of at most 20 nm, and therefore has attained both thickness redaction and capacity increase that could not be attained at all with conventional dielectric elements.

In the invention 4, ultra-thin perovskite nanosheets are used and their thickness is artificially controlled to thereby artificially reconstruct the perovskite nanosheets so as to be suitable to practical applications, and therefore, it has become possible to produce and plan thin films having more excellent dielectric properties than those of conventional perovskite.

The invention 5 has enabled extraction followed by artificial reconstruction of single substance nanosheets from layered perovskite including, as a basic block, an $NbO_6$ octahedron or a $TaO_6$ octahedron known as a high-functional dielectric material, and therefore has enabled production and planning of thin films having more excellent dielectric properties than those of conventional perovskite.

The invention 6 has enabled artificial reconstruction of layered perovskite nanosheets including a high-function dielectric block of an $NbO_6$ octahedron or a $TaO_6$ octahedron, and therefore has enabled production and planning of thin films having more excellent dielectric properties than those of conventional perovskite.

In the invention 7, even poorly self-sustainable perovskite nanosheets can be held on an electrode substrate and therefore can be readily handled; and accordingly, the production of the dielectric element of the above inventions 1 to 6 is secured.

The invention 8 has enabled a low-cost and room-temperature solution process, and therefore has made it possible to provide a high-performance dielectric element, evading the problems of substrate interface deterioration or composition deviation in a conventional device production process.

In addition, this has realized a low-cost low-environmental risk process not requiring any large-scaled vacuum apparatus and expensive film formation apparatus that are the mainstream of conventional dielectric thin film formation processes.

The invention 9 has further enabled a multilayered, high-quality dielectric thin film of perovskite nanosheets, and therefore has made it possible to plan and produce a dielectric element having an intended thickness and an intended electric capacitance.

The invention 10 has further made it possible to produce a high-quality dielectric thin film in which the substrate surface is coated with perovskite nanosheets closely with no gap, and therefore has provided a high-performance dielectric element with no or few defects to cause leak current in circuits.

The invention 11 has further made it possible to produce an inorganic dielectric element from which an organic material such as a polymer is removed all in a room-temperature process, and therefore has provided a high-performance dielectric element absolutely free from the problems of substrate interface deterioration or composition deviation accompanied by the heat treatment in a conventional device production process.

According to a Langmuir-Blodgett process, the invention 12 has made is possible to produce a high-quality dielectric thin film of perovskite nanosheets closely adhering to the surface of the substrate thereof with no gap, and therefore has made it possible to directly produce a high-performance dielectric element with no or few defects to cause leak current in circuits, according to a low-cost and room-temperature solution process.

The invention 13 has further enabled a multilayered, high-quality dielectric thin film of perovskite nanosheets, not using an organic polymer, and therefore has made it possible to plan and produce a dielectric element having an intended thickness and an intended electric capacitance, according to a low-cost and room-temperature solution process.

High-dielectric materials are utilized in all electronic instruments such as DRAM memories for personal computers, gate insulators for transistors, multilayer capacitors for mobile telephones, high-frequency devices and others; and global industry-government-academia collaboration for studies and developments of those materials is under fierce competition, aiming at practical use thereof in place of the current $SiO_2$ and $SiN_x$ in less than 10 years. The economical advantages of the dielectric element developed this time are obvious, taking the following into consideration: (1) The element can function, having the smallest thickness of all the conventional materials, and can realize both a high dielectric constant and good insulating properties; (2) the element can produce according to a room-temperature and low-cost solution process; (3) as having realized the room-temperature process, the invention has completely solved all the problems with conventional thermal annealing; (4) the invention has realized a low-cost low-environmental risk process not requiring any large-scaled vacuum apparatus and expensive film formation apparatus that are the mainstream of conventional semiconductor/dielectric thin film formation processes.

DESCRIPTION OF REFERENCE NUMERALS

| | |
|---|---|
| 1 | Lower Electrode Substrate |
| 2 | Perovskite Nanosheet |
| 3 | Upper Electrode Substrate |

BEST MODE FOR CARRYING OUT THE INVENTION

The invention is characterized by the above, and its embodiments are described below.

Figure 1:
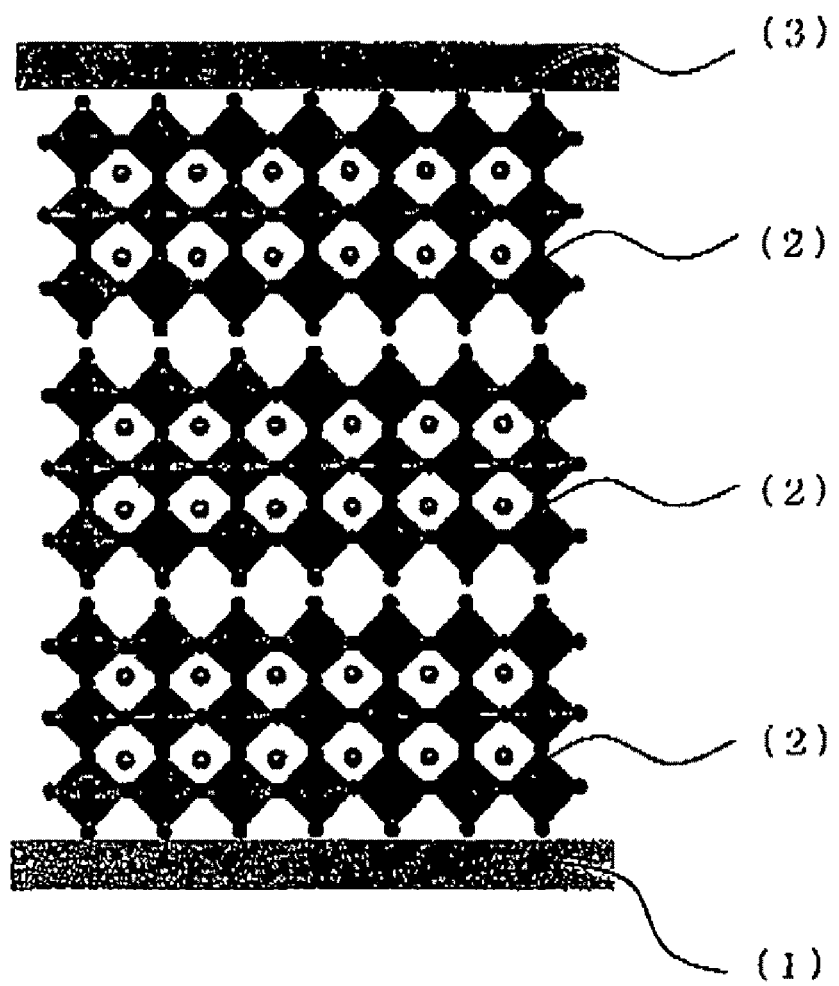
FIG. 1 is a view schematically showing a cross-section structure of a dielectric element comprising a perovskite nanosheet multilayer film of one embodiment of the invention.

FIG. 1 is a view schematically showing a cross-section structure of a dielectric element comprising a perovskite nanosheet multilayer film of one embodiment of the invention.

In FIG. 1, the reference numeral (1) means a lower electrode substrate comprising an atomic planar epitaxial $SrRuO_3$ (this may be hereinafter simply referred to as "substrate"); the reference numeral (2) means a perovskite nanosheet comprising, as the main ingredient thereof, a perovskite oxide represented by a compositional formula $Ca_2Nb_3O_{10}$, which is to be the constitutive layer of a dielectric thin film; and the reference numeral (3) means an upper electrode substrate made of gold. In this embodiment, a multilayer film of perovskite nanosheets (2) is formed on the lower electrode substrate (1) as a dielectric thin film; and the upper electrode substrate (3) is further disposed on the dielectric thin film. This dielectric element can make good use of the inherent properties and the high-level texture and structure controllability of the perovskite nanosheets and can realize both a high dielectric constant and good insulating properties even in a nano-region.

In the invention, the lower electrode substrate (1) is not limited to an atomic planar epitaxial substrate. For example, it may also be a metal electrode of gold, platinum, copper, aluminium or the like, or a conductive perovskite substrate of $SrRuO_3$, Nb-doped $SrTiO_3$ or the like, or a transparent oxide electrode of ITO, Ga-doped ZnO, Nb-doped $TiO_2$ or the like, or a substrate of Si, glass, plastic or the like. Like the lower electrode substrate (1), various types of substrates may be taken into consideration also for the upper electrode (3).

The dielectric element of the invention comprises mainly a monolayer or multilayer film of perovskite nanosheets (2), in which, for example, the perovskite nanosheet may have a particle size of a thickness of at most 5 nm and a lateral size of from 100 nm to 100 μm, more preferably a particle size corresponding to from 3 to 7 atoms and having a thickness of from 0.3 nm to 3 nm.

The perovskite nanosheet having such a particle size can be prepared by soft chemical treatment of a layered perovskite oxide to cleave it into every minimum layer unit of the crystal structure.

Various layered perovskite oxides are usable, and for example, preferred are the following that include a high-function dielectric block of an $NbO_6$ octahedron or a $TaO_6$ octahedron:

Compositional formulae, $HCa_2Nb_3O_{10}$, $LiCa_2Nb_3O_{10}$, $NaCa_2Nb_3O_{10}$, $KCa_2Nb_3O_{10}$, $RbCa_2Nb_3O_{10}$, $CsCa_2Nb_3O_{10}$, $Li_xCa_2Nb_3O_{10}$, $HSr_2Nb_3O_{10}$, $LiSr_2Nb_3O_{10}$, $NaSr_2Nb_3O_{10}$, $KSr_2Nb_3O_{10}$, $RbSr_2Nb_3O_{10}$, $CsSr_2Nb_3O_{10}$, $HBa_2Nb_3O_{10}$, $LiBa_2Nb_3O_{10}$, $NaBa_2Nb_3O_{10}$, $KBa_2Nb_3O_{10}$, $RbBa_2Nb_3O_{10}$, $CsBa_2Nb_3O_{10}$, $HPb_2Nb_3O_{10}$, $LiPb_2Nb_3O_{10}$, $NaPb_2Nb_3O_{10}$, $KPb_2Nb_3O_{10}$, $RbPb_2Nb_3O_{10}$, $CsPb_2Nb_3O_{10}$, $HCa_2Nb_{3-z}Ta_zO_{10}$, $LiCa_2Nb_{3-z}Ta_zO_{10}$, $NaCa_2Nb_{3-z}Ta_zO_{10}$, $KCa_2Nb_{3-z}Ta_xO_{10}$, $RbCa_2Nb_{3-z}Ta_zO_{10}$, $CsCa_2Nb_{3-z}Ta_zO_{10}$, $HSr_2Nb_{3-z}Ta_zO_{10}$, $LiSr_2Nb_{3-z}Ta_zO_{10}$, $NaSr_2Nb_{3-z}Ta_zO_{10}$, $KSr_2Nb_{3-z}Ta_zO_{10}$, $RbSr_2Nb_{3-z}Ta_zO_{10}$, $CsSr_2Nb_{3-x}Ta_zO_{10}$, $HBa_2Nb_{3-z}Ta_zO_{10}$, $LiBa_2Nb_{3-z}Ta_zO_{10}$, $NaBa_2Nb_{3-z}Ta_zO_{10}$, $KBa_2Nb_{3-z}Ta_zO_{10}$, $RbBa_2Nb_{3-x}Ta_xO_{10}$, $CsBa_2Nb_{3-z}Ta_zO_{10}$, $HPb_2Nb_{3-z}Ta_zO_{10}$, $LiPb_2Nb_{3-z}Ta_zO_{10}$, $NaPb_2Nb_{3-z}Ta_zO_{10}$, $KPb_2Nb_{3-z}Ta_zO_{10}$, $RbPb_2Nb_{3-z}Ta_zO_{10}$, $CsPb_2Nb_{3-z}Ta_zO_{10}$, $KLa_2Ti_2NbO_{10}$, $CsLa_2Ti_2NbO_{10}$, $HLa_2Ti_2NbO_{10}$, $HCaLaNb_2TiO_{10}$, $HLa_2Ti_2NbO_{10}$, $LiEu_2Ti_2NbO_{10}$, $NaEu_2Ti_2NbO_{10}$, $CsEu_2Ti_2NbO_{10}$, $RbLaNb_2O_7$, $Rb_2LaNb_2O_2$, $NaLaSrNb_2MnO_9$, $KLaSrNb_2MnO_9$, $RbLaSrNb_2MnO_9$, $RbLaSrNb_2MgO_9$, $RbLaSrNb_3CuO_9$, $RbLaSrNb_2ZnO_9$, $H_2Sr_2Nb_2MnO_{10}$, $Li_2Sr_2Nb_2MnO_{10}$, $Na_2Sr_2Nb_2MnO_{10}$, $Rb_2Sr_2Nb_2MnO_{10}$, $CsLaSrNb_2CuO_9$, $HCa_2Ta_3O_{10}$, $LiCa_2Ta_3O_{10}$, $NaCa_2Ta_3O_{10}$, $KCa_2Ta_3O_{10}$, $RbCa_2Ta_3O_{10}$, $CsCa_2Ta_3O_{10}$, $HSr_2Ta_3O_{10}$, $LiSr_2Ta_3O_{10}$, $NaSr_2Ta_3O_{10}$, $KSr_2Ta_3O_{10}$, $RbSr_2Ta_3O_{10}$, $CsSr_2Ta_3O_{10}$, $HBa_2Ta_3O_{10}$, $LiBa_2Ta_3O_{10}$, $NaBa_2Ta_3O_{10}$, $KBa_2Ta_3O_{10}$, $RbBa_2Ta_3O_{10}$, $CsBa_2Ta_3O_{10}$, $HPb_2Ta_3O_{10}$, $LiPb_2Ta_3O_{10}$, $NaPb_2Ta_3O_{10}$, $KPb_2Ta_3O_{10}$, $RbPb_2Ta_3O_{10}$, $CsPb_2Ta_3O_{10}$, $H_2NaCa_2Ta_3O_{10}$, $Li_2Ca_2Ta_3O_{10}$, $Na_2Ca_2Ta_3O_{10}$, $Li_2Ca_2Ta_3O_{10}$, $H_2CaNaTa_3O_{10}$, $H_2Ca_2Ta_2TiO_{10}$, $CaNaTa_3O_9$, $Ca_2Ta_2TiO_3$, $H_2SrLaTi_2TaO_{10}$, $SrLaTi_2TaO_9$, $H_2SrLaTi_2TaO_{10}$, $H_2Ca_2Ti_2TaO_9$, $Li_2LaTa_2O_7$, $LiLaTa_2O_7$, $H2SrTa_2O_7$, $SrTa_2O_6$ ($0<x≦1$; $0<z≦3$).

The soft chemical treatment for cleavage is a combined treatment of acid treatment and colloldalization treatment. Specifically, a powder or a single crystal of a phyllo-structured perovskite oxide is contacted with an aqueous acid solution, and the product is collected through filtration, washed and dried, whereby the alkali metal ions having existed between the layers before the treatment are all substituted with hydrogen ions to give a hydrogen-type substance. Next, the obtained hydrogen-type substance is put into an aqueous solution of an amine or the like and stirred therein, which is thus colloidalized. In this process, the layers having formed a phyllo-structure are cleaved into the individual layers. The aqueous solution is used as a perovskite nanosheet sol solution (colloid solution) to be mentioned hereinunder.

The cleaved perovskite nanosheets are adhered to a substrate, based on the alternate self-organization lamination technology already proposed by the present inventors (JP-A 2001-270022, 2004-255684). The perovskite nanosheets have a negative charge. Accordingly, the perovskite nanosheets are combined with a polymer having a positive charge, therefore making use of the above-mentioned alternate self-organization lamination technology. According to this technology, perovskite nanosheets can be alternately adsorbed by the surface of a substrate processed suitably, in a mode of self-organization based on the electrostatic interaction therebetween.

In an actual process, an adhesion step (A) of the following operations (1) to (4) as one cycle is repeated for necessary times whereby an organic polymer and perovskite nanosheets are alternatively adsorbed by a substrate. The adhesion step is repeated, whereby a layer of an organic polymer and a layer of perovskite nanosheets are alternately formed to give a multilayer structure of perovskite nanosheets. The repetitive frequency of the adhesion step (A) may be suitably determined in accordance with the thickness of the intended dielectric thin film, and, for example, it may be from once to 10 times. In case where the adhesion step (A) is effected once, a monolayer film of perovskite nanosheets is formed on a substrate.

(1) A substrate is dipped in a solution of a cationic organic polymer.
(2) The substrate is washed with pure water.
(3) The substrate is dipped in a perovskite nanosheet sol solution.
(4) The substrate is washed with pure water.

In the above operation (1), a substrate is dipped in a solution of a cationic organic polymer, whereby the organic polymer is adsorbed by the substrate and a positive charge is introduced into the surface of the substrate. Accordingly, the subsequent lamination of perovskite nanosheets can be attained stably.

As the cationic organic polymer, suitable are polyethyleneimine (PEI) described in Examples, and also polydiallyldimethylammonium chloride (PDDA), polyallylamine hydrochloride (PAH) and the like having the same cationic property. For example, a polyethyleneimine (PEI) solution as a cationic organic polymer solution may be prepared by dissolving 0.25 g of an aqueous 50% polyethyleneimine solution in 100 cm$^3$ of pure water, and then controlling the pH of the solution to be 9 with hydrochloric acid. In the process, a solution favorable for the operation (1) can be prepared. Polydiallyldimethylammonium chloride (PDDA) and polyallylamine hydrochloride (PAH) can also be processed in the same manner to prepare their solutions. In alternate lamination of organic polymer and perovskite nanosheets, it is important to introduce a positive charge into the substrate surface. Accordingly, any positive charge-having inorganic polymer and polynuclear hydroxide ion-containing inorganic compound can be usable in place of the organic polymer so far as they can introduce a positive charge into the substrate surface.

In the above-mentioned adhesion step (A), the thickness of the thin film comprising the organic polymer and the perovskite nanosheets formed on the substrate surface can be stepwise increased in a range of from a sub-nanometer order to a nanometer order, and the film thickness can be controlled on a level of an extremely fine region. Specifically, the thin film can be formed on the substrate at a film thickness accuracy of at most 1 nm, and depending on the frequency of the repetition of the adhesion steps, the final film thickness can be increased to 20 nm or less, for example, about 1 nm or so and even to a micro-nanometer level.

In the above-mentioned adhesion step (A), the perovskite nanosheets are adsorbed relatively strongly by the substrate owing to the electrostatic interaction thereof with the organic polymer and are thereby cumulatively deposited on the substrate. In this step, in the part where some perovskite nanosheets are overlapped with other perovskite nanosheets, there occurs repulsion between them owing to the negative charge that the perovskite nanosheet have, and the adhesive force of the perovskite nanosheets in the overlapping part is relatively weak. When the substrate coated with a thin film having such an overlapping part is ultrasonically processed in an aqueous alkali solution, then the perovskite nanosheets-overlapping part can be removed owing to the washing effect through cavitation to occur in the aqueous solution. Accordingly, only the part of perovskite nanosheets adsorbed by the substrate relatively firmly and closely with no gap remains on the substrate, and a high-quality dielectric element can be thus provided.

The above-mentioned ultrasonic treatment may be attained with an ordinary commercially-available ultrasonic washer. The frequency of the ultrasonic waves to be given to the substrate may be any one capable of generating cavitation and is, for example, at least 20 Hz.

Further, in the invention, after the above-mentioned adhesion step (A), the substrate may be irradiated with UV rays to produce an inorganic dielectric element with no organic polymer according to the room-temperature process. In conventional production of dielectric elements, the properties of the products are often deteriorated, including, for example, substrate interface deterioration, composition deviation or the like accompanied by the heat treatment in the production process; however, in the invention, high-quality dielectric elements can be produced according to the room-temperature process as above.

The irradiation with UV rays may be in any mode of irradiation with UV rays containing a wavelength of not more than band gaps at which the photocatalytic organic substance decomposition reaction of layered perovskite oxides is active, and more preferred is irradiation for at least 12 hours with a xenon light source of at least 4 mW/cm$^2$.

Apart from the above-mentioned adhesion step (A), a similar monolayer film or multilayer film of perovskite nanosheets can be formed on a substrate according to the adhesion step (B) based on a Langmuir-Blodgett process (hereinafter this may be simply referred to as "LB process").

The LB process is known as a film formation method for a clay mineral or organic nano-thin film in which an association membrane is formed on a vapor-water interface with using amphiphilic molecules, and this is drawn up and transferred onto a substrate to produce a uniform monolayer film. Perovskite nanosheets do not require use of amphiphilic cationic molecules, and when a low-concentration perovskite nanosheet sol solution is used, the nanosheets can be adsorbed by a vapor/water interface to give a uniform monolayer film. Accordingly, neither using the cationic organic polymer as in the above-mentioned adhesion step (A) nor requiring any additional treatment such as ultrasonic treatment, a high-quality dielectric element can be produced in which the surface of the substrate is coated with perovskite nanosheets closely with no gap.

When the adhesion step (B) is repeated, monolayer films may be laminated on a substrate thereby producing a multilayer structure of perovskite nanosheets.

The invention provides a method for producing a dielectric element, comprising, as at least a part thereof, any of the above adhesion step (A) or adhesion step (B).

For example, in the embodiment of the following Examples, perovskite nanosheets are produced, starting from a layered perovskite oxide ($KCa_2Nb_3O_{10}$), and a multilayer film of the perovskite nanosheets is formed on an atomic planar epitaxial $SrRuO_3$ substrate according to the adhesion step (A) or the adhesion step (B), as in FIG. 1.

After the multilayer film of perovskite nanosheets (2) is formed on the substrate (1) as a dielectric thin film, an upper electrode substrate is disposed on the dielectric thin film to construct a dielectric element. The upper electrode substrate may be disposed thereon through dot-like film formation of a metal electrode of gold, platinum or the like via a metallic mask with pores having a diameter of from 10 µm to 100 µm, using a vacuum evaporation apparatus or a sputtering apparatus.

In the dielectric element thus produced in the manner as above, a dielectric thin film having a thickness of from 1.3 to 200 nm is formed on the substrate with accuracy of at most 1 nm. In particular, in the dielectric element of the invention, the dielectric thin film may have a thickness of at most 20 µm, and the dielectric element may have a specific dielectric constant of at least 150. For example, the dielectric element of the invention, in which the thickness of the dielectric thin film is from 4 to 20 nm, may be from 150 to 250 in specific dielectric constant, especially from 155 to 240 in specific dielectric constant. In case where perovskite nanosheets having a composition of $Ca_2Nb_3O_{10}$ is used, the dielectric element produced of the invention, in which the dielectric thin film has a thickness of from 4 to 10 nm, may have a high specific dielectric constant of at least 200, for example, from 200 to 210. Further, the dielectric element of the invention can prevent current leakage more effectively than other dielectric elements comprising a conventional perovskite-type oxide thin film $(Ba,Sr)TiO_3$, and therefore exhibit extremely excellent insulating properties. For example, as shown in Examples to be given hereinunder, a dielectric element of the invention and a conventional dielectric element, in which the thickness of the dielectric thin film was 10 nm, were analyzed for the leak current density therethrough, and the leak current through the dielectric element of the invention was prevented more effectively by about 1000 times than that through the conventional dielectric element.

Needless-to-say, the invention should not be limited by the Examples given hereinunder. For example, in producing a dielectric element, perovskite nanosheets may be adhered to the upper electrode substrate to thereby form a monolayer film or a multilayer film of perovskite nanosheets on the upper electrode. In this case, perovskite nanosheets may be or may not be adhered to the lower electrode substrate. Accordingly, the two electrode substrate may be so disposed that a layer of perovskite nanosheets can be put between the upper electrode substrate and the lower electrode substrate, thereby constructing a dielectric element.

EXAMPLES

Example 1

In this Example, perovskite nanosheets were produced, starting from a layered perovskite oxide (e.g., $KCa_2Nb_3O_{10}$); and as in FIG. 1, a multilayer film of the perovskite nanosheets (2), serving as a dielectric thin film, and an upper electrode substrate (3) were formed on the lower electrode substrate (1) comprising atomic planar epitaxial $SrRuO_3$, thereby constructing a dielectric element in the manner mentioned below.

The layered perovskite oxide ($KCa_2Nb_3O_{10}$) was prepared by mixing potassium carbonate, calcium carbonate and niobium oxide in a ratio, K/Ca/Nb of 1.1/2/3, and baking the mixture at 1473K for 12 hours. 5 g of the powder was acid-treated in 200 cm$^3$ of 5 N nitric acid solution at room temperature to give a hydrogen-exchanged layered perovskite oxide ($HCa_2Nb_3O_{10}\cdot1.5H_2O$); and thereafter 100 cm$^3$ of an aqueous solution of tetrabutylammonium hydroxide (hereinafter referred to as TBAOH) was added to 0.4 g of the hydrogen-exchanged layered perovskite oxide, and reacted with stirring at room temperature for 7 days to give a milky white sol solution with, as dispersed therein, rectangular perovskite nanosheets (2) having a compositional formula $Ca_2Nb_3O_{10}$ and having a thickness of about 1.4 nm and a lateral size of from 100 nm to 2 µm.

On the other hand, a solution of a cationic polymer, polyethylene imine (PEI) was prepared. The polyethyleneimine (PEI) solution was produced by dissolving 0.25 g of polyethyleneimine (Aldrich's aqueous 50% solution) in 100 cm$^3$ of Milli-Q pure water, and then the pH of the resulting solution was controlled to be 9 with hydrochloric acid.

The surface of the substrate (1) was washed through irradiation with UV rays in an ozone atmosphere, and this was dipped in a solution of hydrochloric acid/methanol=1/1 for 20 minutes, and then dipped in concentrated sulfuric acid for 20 minutes for hydrophilication treatment.

The substrate (1) was processed according to a series of the following operations [1] to [5] as one cycle mentioned below, repeatedly for the necessary number of cycles, thereby producing a perovskite nanosheet thin film (multilayer film) having a thickness necessary for the desired dielectric thin film.

[1] Dipping in the above PEI solution for 20 minutes.

[2] Fully washing with Milli-Q pure water.

[3] Dipping in the above nanosheet sol solution with stirring.

[4] After 20 minutes, fully washing with Milli-Q pure water.

[5] With dipping in an aqueous TBAOH solution having a pH of 11, the obtained thin film is ultrasonically processed for 20 minutes in an ultrasonic washing tank (by Branson, 43 kHz, 90 W).

Thus produced, the perovskite nanosheet thin film was irradiated with UV rays from a xenon light source (4 mW/cm$^2$, 72 hours) to remove the organic polymer through the photocatalytic reaction with the perovskite nanosheets, thereby giving a polymer-free perovskite nanosheet thin film.

Table 1 shows the data of the leak current density and the specific dielectric constant of the thin film elements (dielectric elements) comprising the multilayer perovskite nanosheet thin film (number of laminated layers, 3 or 5) and a gold electrode serving as the upper electrode substrate. In this, the multilayer perovskite nanosheet thin film comprising three laminated layers was produced by repeating 3 times the above cycle of [1] to [5]; and the multilayer perovskite nanosheet thin film comprising five laminated layers was produced by repeating 5 times the cycle. The gold electrode of the upper electrode was formed via a metallic mask with pores having a diameter of 100 µm, using vacuum evaporation apparatus. Accordingly, dielectric elements were constructed, having, as formed on the multilayer perovskite nanosheet thin film, a large number of dot-like gold electrodes having a diameter of 100 µm.

The leak current density is a current density measured with a semiconductor parameter analyzer (Keithley's 4200-SCS) with voltage application of +1V to the sample. On the other hand, for the specific dielectric constant, the electrostatic capacity is measured with a high-precision LCR meter (Agilent Technology's 4284A) at a frequency of 10 kHz, and the specific dielectric constant is computed from the data.

TABLE 1

| Composition | Number of Laminated Layers | Film Thickness | Leak Current Density | Specific Dielectric Constant |
|---|---|---|---|---|
| $Ca_2Nb_3O_{10}$ | 3 | 4.2 nm | $1.1 \times 10^{-7}$ A/cm$^2$ | 208 |
| $Ca_2Nb_3O_{10}$ | 10 | 7 nm | $2.6 \times 10^{-8}$ A/cm$^2$ | 205 |

Table 1 shows that the leak current property of the dielectric elements comprising the multilayer perovskite nanosheet thin film as a dielectric thin film was on a level of at most $10^{-7}$ A/cm$^2$ though the film thickness was from 4.2 to 7 nm and was ultra-thin, and the dielectric elements both exhibited good insulating properties. The dielectric element of the invention and a conventional dielectric element with an already-existing perovskite-type oxide thin film (Ba,Sr)TiO$_3$, in which the thickness of the dielectric thin film was 10 nm, were compared in point of the leak current density therethrough, and the leak current through the former was prevented more effectively by about 1000 times than that through the latter, and the dielectric element of the invention exhibited extremely excellent insulating properties. In addition, the specific dielectric constant of the dielectric elements of the invention was at least 200 irrespective of the number of the laminated layers, and was high.

Example 2

In this Example, a multilayer film of perovskite nanosheets (Ca$_2$Nb$_3$O$_{10}$) (2), serving as a dielectric thin film, was formed on the lower electrode substrate (1) comprising atomic planar epitaxial SrRuO$_3$, according to an LB process (Langmuir-Blodgett process), and an upper electrode substrate (3) was disposed on it, thereby constructing a dielectric element as in FIG. 1. The concrete production method is as follows.

In this Example, perovskite nanosheets (Ca$_2$Nb$_3$O$_{10}$) were produced, starting from a layered perovskite oxide (e.g., KCa$_2$Nb$_3$O$_{10}$).

According to the same method as in Example 1, a layered perovskite oxide (KCa$_2$Nb$_3$O$_{10}$) was cleaved into single layers, thereby producing a milky white sol solution with, as dispersed therein, rectangular nanosheets having a compositional formula Ca$_2$Nb$_3$O$_{10}$ and having a thickness of about 1.4 nm and a lateral size of from 100 nm to 2 µm.

The surface of the substrate (1) was washed through irradiation with UV rays in an ozone atmosphere, and this was dipped in a solution of hydrochloric acid/methanol=1/1 for 20 minutes, and then dipped in concentrated sulfuric acid for 20 minutes for hydrophilication treatment.

In a 1-dm$^3$ volumetric flask, 8 mdm$^3$ of the perovskite nanosheet sol solution was dispersed in ultra-pure water. The dispersion was left as such for about a half day to one day or so, and then the dispersion was spread on an LB trough well washed with acetone, and kept as such for 40 minutes for which the liquid surface was stabilized and the temperature of the lower layer liquid reached constant. Next, the above-prepared substrate (1) was set in an LB film formation apparatus, and processed according to the following operations [1] and [2] as one cycle, repeatedly for the necessary number of cycles, thereby producing a perovskite nanosheet thin film (multilayer film) having a desired film thickness.

[1] The barrier is compressed at a compression speed of 0.5 mm/sec, whereby the perovskite nanosheets dispersed on the vapor/water interface are collected, and after the system has reached a predetermined pressure, this is statically kept as such for 30 minutes. In that manner, a monolayer film is formed in which the perovskite nanosheets are aligned in parallel and are integrated in the vapor/water interface.

[2] The substrate (1) is vertically drawn up at a drawing speed of 0.8 mm/sec. Accordingly, the monolayer film is adhered to the substrate, in which the perovskite nanosheets (2) are closely packed in the thus-produced monolayer film.

Figure 2:
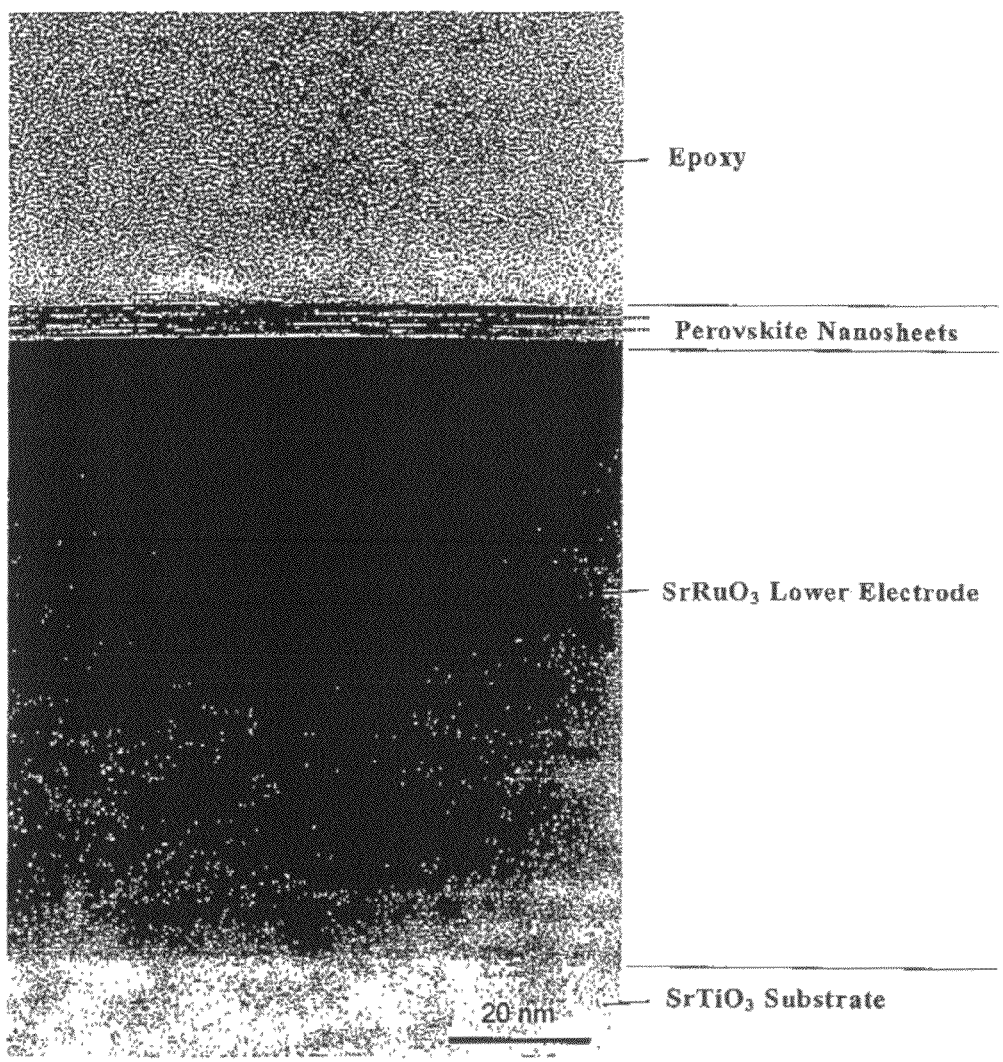
FIG. 2 is a result of evaluation in observation with a high-resolution transmitting electronic microscope of the cross-section structure of the multilayered perovskite nanosheet thin film where three layers are laminated, as produced in Example 2.

FIG. 2 is a result of evaluation in observation with a high-resolution transmitting electronic microscope of the cross-section structure of the perovskite nanosheet thin film of the multilayered perovskite nanosheet thin film where three monolayer films of perovskite nanosheets are laminated, as produced in the process of repeating three times the above-mentioned cycle. In FIG. 2, a multilayer structure of nanosheets accumulated in parallel on an atomic level on the lower electrode is confirmed. It can be said that a high-quality multilayer film was realized, in which monolayer films were laminated layer by layer with securing the compactness and the smoothness of the monolayer films. The matter that should be further noted in FIG. 2 is that there was formed neither a low-dielectric layer nor an interlayer accompanied by the substrate interface deterioration and the composition deviation in thermal annealing in the production process, which was problematic in already-existing high-dielectric oxide materials, between the lower electrode and the perovskite nanosheet thin film. This supports the remarkable effect of the invention in that the production process for the multilayer perovskite nanosheet thin film of this Example is based on a room-temperature solution process free from problems of substrate interface deterioration and composition deviation.

Table 2 shows the data of the leak current density and the specific dielectric constant of the dielectric elements comprising, as the dielectric thin film, a perovskite nanosheet thin film formed by lamination of 3 layers, 5 layers or 10 layers of perovskite nanosheet monolayer films. Like in Example 1, the upper electrode substrate of the dielectric element was a gold electrode, and was disposed in the same manner as therein.

The leak current density is a current density measured with a semiconductor parameter analyzer (Keithley's 4200-SCS) with voltage application of +1V to the sample. On the other hand, for the specific dielectric constant, the electrostatic capacity is measured with a high-precision LCR meter (Agilent Technology's 4284A) at a frequency of 10 kHz, and the specific dielectric constant is computed from the data.

TABLE 2

| Composition | Number of Laminated Layers | Film Thickness | Leak Current Density | Specific Dielectric Constant |
|---|---|---|---|---|
| $Ca_2Nb_3O_{10}$ | 3 | 4.2 nm | $1.7 \times 10^{-8}$ A/cm$^2$ | 209 |
| $Ca_2Nb_3O_{10}$ | 5 | 7 nm | $4.5 \times 10^{-9}$ A/cm$^2$ | 204 |
| $Ca_2Nb_3O_{10}$ | 10 | 14 nm | $1.8 \times 10^{-9}$ A/cm$^2$ | 208 |

Table 2 shows that the leak current property of the dielectric elements comprising the multilayer perovskite nanosheet thin film of monolayer films as a dielectric thin film was on a level of at most $10^{-7}$ A/cm$^2$ though the film thickness was from 4.2 to 14 nm and was ultra-thin, and the dielectric elements all exhibited good insulating properties. The dielectric element of the invention and a conventional dielectric element with an already-existing perovskite-type oxide thin film (Ba,Sr)TiO$_3$, in which the thickness of the dielectric thin film was 10 nm, were compared in point of the leak current density therethrough, and the leak current through the former was prevented more effectively by about 1000 times than that through the latter, and the dielectric element of the invention exhibited extremely excellent insulating properties. In addition, the specific dielectric constant of the dielectric elements of the invention was at least 200 irrespective of the number of the laminated layers, and was high.

Figure 3:
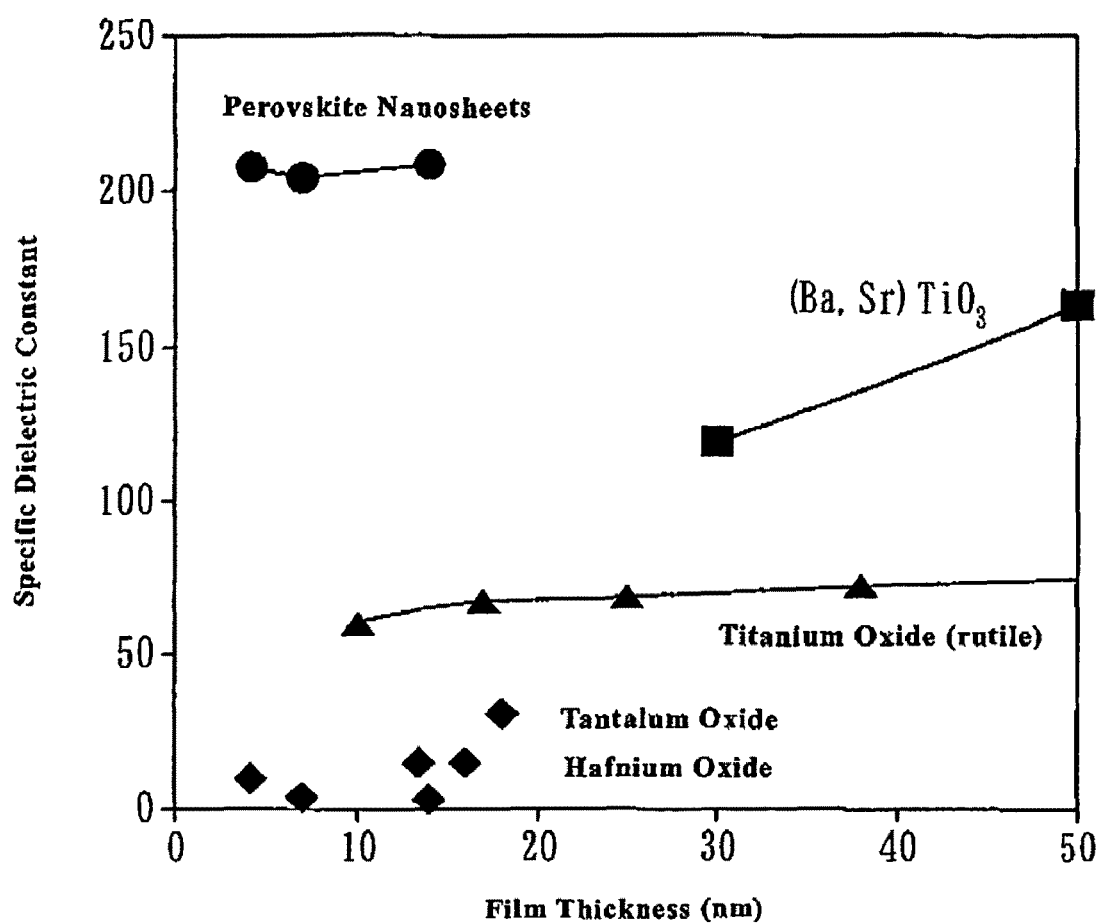
FIG. 3 is a view of comparing the dielectric element comprising a perovskite nanosheet thin film produced in Example 2 and a dielectric element comprising a typical high-dielectric oxide material, in point of the film thickness dependence of the specific dielectric constant thereof.

FIG. 3 shows plotted data of the film thickness dependence of the specific dielectric constant of the dielectric elements having a perovskite nanosheet thin film formed by lamination of 3 layers, 5 layers or 10 layers of perovskite nanosheet monolayer films according to an LB process. In addition, this shows, for comparison, the film thickness dependence of the specific dielectric constant of typical high-dielectric oxide materials. When an already-existing perovskite oxide, for example, $(Ba,Sr)TiO_3$ is thinned to a nano-level for the purpose of attaining increased capacity, then the specific dielectric constant thereof lowers; but contrary to this, the perovskite nanosheet thin films of the invention are free from any remarkable "size effect, and kept a high specific dielectric constant of at least 200 even though they had a thickness of from around 5 to 10 nm and was thin. The matter to be specifically noted is that the perovskite nanosheet thin films of the invention have a greatly larger specific dielectric constant far over any other already-existing high-dielectric oxide materials in the thin films region of 10 nm. Accordingly, the invention has an epoch-making effect of bringing about size-free high dielectric properties capable of realizing both a high dielectric constant and good insulating properties in a nano-scale region.

Example 3

In this Example, a multilayer film of perovskite nanosheets ($Sr_2Nb_3O_{10}$, $Ca_2Ta_3O_{10}$, $Sr_2Ta_3O_{10}$) (2), serving as a dielectric thin film, was formed on the lower electrode substrate (1) comprising atomic planar epitaxial $SrRuO_3$, according to an LB process, and an upper electrode substrate (3) was disposed on it, thereby constructing a dielectric element as in FIG. 1. The concrete production method is as follows.

In this Example, perovskite nanosheets ($Sr_2Nb_3O_{10}$, $Ca_2Ta_3O_{10}$, $Sr_2Ta_3O_{10}$) were produced, starting from a layered perovskite oxide (e.g., $KSr_2Nb_3O_{10}$, $KCa_2Ta_3O_{10}$, $KSr_2Ta_3O_{10}$).

The layered perovskite oxides ($KSr_2Nb_3O_{10}$, $KCa_2Ta_3O_{10}$, $KSr_2Ta_3O_{10}$) were prepared by mixing potassium carbonate, calcium carbonate and niobium oxide (or tantalum oxide) in a ratio, K/Ca/Nb(Ta) of 1.1/2/3, and baking the mixture at 1473K for 12 hours. 5 g of the powder was acid-treated in 200 cm$^3$ of 5 N nitric acid solution at room temperature to give a hydrogen-exchanged layered perovskite oxide; and thereafter 100 cm$^3$ of an aqueous solution of tetrabutylammonium hydroxide (hereinafter referred to as TBAOH) was added to 0.4 g of the hydrogen-exchanged layered perovskite oxide, and reacted with stirring at room temperature for 7 days to give a milky white sol solution with, as dispersed therein, rectangular nanosheets having a compositional formula $Sr_2Nb_3O_{10}$, $Ca_2Ta_3O_{10}$ or $Sr_2Ta_3O_{10}$ and having a thickness of from 1.5 to 2.0 nm and a lateral size of from 100 nm to 2 μm.

The surface of the substrate (1) was washed through irradiation with UV rays in an ozone atmosphere, and this was dipped in a solution of hydrochloric acid/methanol=1/1 for 20 minutes, and then dipped in concentrated sulfuric acid for 20 minutes for hydrophilication treatment.

In a 1-dm$^3$ volumetric flask, 8 mdm$^3$ of the perovskite nanosheet sol solution was dispersed in ultra-pure water. The dispersion was left as such for about a half day to one day or so, and then the dispersion was spread on an LB trough well washed with acetone, and kept as such for 40 minutes for which the liquid surface was stabilized and the temperature of the lower layer liquid reached constant. Next, the above-prepared substrate (1) was set in an LB film formation apparatus, and processed according to the following operations [1] and [2] as one cycle, repeatedly for 10 cycles, thereby producing a perovskite nanosheet thin film (multilayer film) having a desired film thickness.

[1] The barrier is compressed at a compression speed of 0.5 mm/sec, whereby the perovskite nanosheets dispersed on the vapor/water interface are collected, and after the system has reached a predetermined pressure, this is statically kept as such for 30 minutes. In that manner, a monolayer film is formed in which the perovskite nanosheets are aligned in parallel and are integrated in the vapor/water interface.

[2] The substrate (1) is vertically drawn up at a drawing speed of 0.8 mm/sec. Accordingly, the monolayer film is adhered to the substrate, in which the perovskite nanosheets (2) are closely packed in the thus-produced monolayer film.

Table 3 shows the data of the leak current density and the specific dielectric constant of the dielectric elements comprising, as the dielectric thin film, a perovskite nanosheet thin film formed by lamination of 10 layers of perovskite nanosheet ($Sr_2Nb_3O_{10}$, $Ca_2Ta_3O_{10}$, $Sr_2Ta_3O_{10}$) monolayer films. Like in Example 1, the upper electrode substrate of the dielectric element was a gold electrode, and was disposed in the same manner as therein.

The leak current density is a current density measured with a semiconductor parameter analyzer (Keithley's 4200-SCS) with voltage application of +1V to the sample. On the other hand, for the specific dielectric constant, the electrostatic capacity is measured with a high-precision LCR meter (Agilent Technology's 4284A) at a frequency of 10 kHz, and the specific dielectric constant is computed from the data.

TABLE 3

| Composition | Number of Laminated Layers | Film Thickness | Leak Current Density | Specific Dielectric Constant |
|---|---|---|---|---|
| $Sr_2Nb_3O_{10}$ | 10 | 15 nm | $4.5 \times 10^{-9}$ A/cm$^2$ | 240 |
| $Ca_2Ta_3O_{10}$ | 10 | 19 nm | $1.4 \times 10^{-9}$ A/cm$^2$ | 180 |
| $Sr_2Ta_3O_{10}$ | 10 | 20 nm | $6.5 \times 10^{-10}$ A/cm$^2$ | 155 |

Table 3 shows that the leak current property of all the multilayer perovskite nanosheet thin films was on a level of at most 10$^9$ A/cm$^2$ though the film thickness was from 15 to 20 nm and was ultra-thin, and the films all exhibited good insulating properties. In addition, the specific dielectric constant of the multilayer perovskite nanosheet thin films was from 155 to 240, and was high.

As in the above Examples 1 to 3, the perovskite nanosheet thin film of the invention has a greater relative specific constant far over already-existing high-dielectric oxide materials in a 10-nm level ultra-thin film region. Accordingly, the invention has an epoch making effect of bringing about size-free high dielectric properties capable of realizing both a high dielectric constant and good insulating properties in a nano-region.

When the multilayer perovskite nanosheet thin film produced in the manner as above is applied to DRMA memories and others, then it is possible to obtain devices having a higher capacity by at least dozens of times than already-existing high-dielectric oxide materials having the same film thickness. Further, the invention has other excellent effects in that leak current can be prevented and consuming current can be reduced and that, in increased memory and transistor integrations, various types (trench type or stack type) of devices can be designed in any desired manner.

The embodiments in the above are for describing the invention with reference to an example of forming a multilayer perovskite nanosheet thin film on an atomic planar epitaxial $SrRuO_3$ substrate and applying it to a DRAM memory; however, the dielectric element of the invention can be used as a thin-film capacitor by itself, and can also be used for gate insulators for transistors, multilayer capacitors for mobile telephones, high-frequency devices and others, exhibiting the same excellent effects.

The invention claimed is:

1. A dielectric element comprising a dielectric thin film formed between electrodes, wherein the dielectric thin film is formed of perovskite nanosheets prepared through single layer cleavage of phyllo-perovskite oxide crystals, or a multilayer thereof.

2. The dielectric element as claimed in claim 1, wherein the perovskite nanosheets are laminated via a cationic organic polymer.

3. The dielectric element as claimed in claim 1, wherein the thickness of the dielectric thin film is at most 20 nm and the specific dielectric constant thereof is at least 150.

4. The dielectric element as claimed in claim 1, wherein the perovskite nanosheet has a sheet-like configuration having a thickness of at most 5 nm and having a lateral size of from 100 nm to 100 μm.

5. The dielectric element as claimed in claim 1, wherein the perovskite nanosheet is one produced by cleaving a layered perovskite oxide, and the layered perovskite oxide is any one or a hydrate thereof represented by a compositional formula $A_xCa_2Nb_3O_{10-d}$, $A_xCa_{2-y}M_yNb_{3-z}M'_zO_{10-d}$, $A_xM_2M'_3O_{10-d}$ or $A[Ca_{n-1}Na_{n-3}Nb_nO_{3n+1-d}]$ (A is at least one selected from H, Li, Na, K, Rb and Cs, $0<x\leq1$; M is at least one selected from Sr, Ba, Pb or rare earth elements La, Ce, Pr, Sm, Eu, Gd, Tb, Dy, Ho, Er, Tm, Yb and Lu, $0<y\leq1$; M' is at least one selected from Ta, Ti, Mg, Mn and Zn, $0<z\leq3$; n=2 to 4; d=0 to 2).

6. The dielectric element as claimed in claim 5, wherein the perovskite oxide has a perovskite structure represented by a compositional formula $Ca_2Nb_3O_{10-d}$, $Ca_{2-y}M_yNb_{3-z}M'_zO_{10-d}$, $M_2M'_3O_{10-d}$ or $[Ca_{n-1}Na_{n-3}Nb_nO_{3n+1-d}]$ ($0<x\leq1$; M is at least one selected from Sr, Ba, Pb or rare earth elements La, Ce, Pr, Sm, Eu, Gd, Tb, Dy, Ho, Er, Tm, Yb and Lu, $0<y\leq1$; M' is at least one selected from Ta, Ti, Mg, Mn and Zn, $0<z\leq3$; n=2 to 4; d=0 to 2).

7. A method for producing a dielectric element of claim 1, wherein perovskite nanosheets prepared through cleavage of a phyllo-perovskite oxide to individual single layers are adhered onto at least any one electrode substrate of two electrode substrates constituting a dielectric element, as a monolayer film thereon, and then the two electrode substrates are so disposed that the perovskite nanosheets can be between the two electrode substrates.

8. The production method for a dielectric element as claimed in claim 7, wherein the perovskite nanosheets are adhered onto the electrode substrate according to the following adhesion step (A):
wherein the electrode substrate is dipped in a cationic organic polymer solution so that the organic polymer is adsorbed by the surface of the electrode substrate, and then this is further dipped in a colloidal solution with perovskite nanosheets suspended therein to thereby make the perovskite nanosheets adsorbed by the organic polymer.

9. The production method for a dielectric element as claimed in claim 8, wherein the adhesion step (A) is repeated to form a multilayer structure of perovskite nanosheets.

10. The production method for a dielectric element as claimed in claim 9, wherein the overlapping parts of the perovskite nanosheets are removed by applying ultrasonic waves thereto.

11. The production method for a dielectric element as claimed in claim 8, wherein the organic polymer is removed through irradiation with UV rays after the adhesion step (A).

12. The production method for a dielectric element as claimed in claim 7, wherein the perovskite nanosheets are adhered onto the electrode substrate according to the following adhesion step (B):
wherein a monolayer film with perovskite nanosheets bonded in parallel to each other is formed according to a Langmuir-Blodgett process, and the monolayer film is adhered to the electrode substrate.

13. The production method for a dielectric element as claimed in claim 12, wherein the adhesion step (B) is repeated to laminate the monolayer films on the electrode substrate to thereby form a multilayer structure of perovskite nanosheets.

* * * * *